United States Patent [19]
Kuroda et al.

[11] Patent Number: 4,961,194
[45] Date of Patent: Oct. 2, 1990

[54] COMPOUND SEMICONDUCTOR DEVICE HAVING NONALLOYED OHMIC CONTACTS

[75] Inventors: Shigeru Kuroda, Sagamihara; Takashi Mimura, Machida; Seishi Notomi, Yamato, all of Japan

[73] Assignee: Fujitsu Limited, Kawasaki, Japan

[21] Appl. No.: 455,853

[22] Filed: Dec. 21, 1989

Related U.S. Application Data

[63] Continuation of Ser. No. 169,890, Mar. 18, 1988, abandoned.

[30] Foreign Application Priority Data

Mar. 18, 1987 [JP] Japan .................................. 62-61097

[51] Int. Cl.$^5$ ............................................. H01L 29/80
[52] U.S. Cl. ......................................... 357/22; 357/16; 357/15; 357/90; 357/65; 357/4
[58] Field of Search .............. 357/22 A, 22 MD, 22 I, 357/16, 15, 65, 67, 71, 22 K, 90, 22 J, 22 L, 4

[56] References Cited

U.S. PATENT DOCUMENTS 4,325,181  4/1962  Yoder ................................ 357/15 X
4,593,301  6/1986  Inata et al. ......................... 357/22 A

FOREIGN PATENT DOCUMENTS 0042066   5/1981   European Pat. Off.
0078679  10/1982   European Pat. Off.
59-123272  7/1984  Japan ............................ 357/22 MD
60-164366  8/1985  Japan ............................. 357/22 A

OTHER PUBLICATIONS

Coblenz, "Semiconductor Compounds", *Electronics Buyers' Guide*, Jun. 1958, Mid-Month, pp. R-4 to R-5.
Woodall et al., "Ohmic Contacts to N-GaAs Using Graded Band Gap Layers of $Ga_{1-x}As$ Grown by Molecular Beam Epitaxy," *J. Vac. Sci. Technol*, 19(3), Sep.-/Oct. 1981, pp. 626-627.
Ng et al., "Study of the Consequence of Excess Indium in the Active Channel of InGaAs/InAlAs High Electron Mobility Transistors on Device Properties," *Appl. Phys. Lett.*, 52(9), Feb. 29, 1988, pp. 728-730.
Electronic Letters, vol. 20, No. 15, Jul. 1984, pp. 615-618, Stevenage, Herts, GB; H. Dambkes et al., "Optimisation of Modulation-Doped Heterostructures for TEGFET Operation at Room Temperature".
IEEE Electron Device Letters, vol. EDL-8, No. 1, Jan. 1987, pp. 24-26, IEEE, New York, U.S.; C. K. Peng et al.: "Microwave Performance of InAlAs/InGaAs/InP MODFET's".
Electronics Letters, vol. 17, No. 6, Mar. 19, 1981, pp. 215-216, London, GB; T. Ishibashi: "InP MESFET with In0.53Ga0.47/As/InP Heterostructure Contacts".

*Primary Examiner*—William Mintel
*Attorney, Agent, or Firm*—Staas & Halsey

[57] ABSTRACT

An ohmic contact layer is provided between an n-GaAs/n-AlGaAs/undoped GaAs double-heterojunction structure and source/drain electrodes in a high electron mobility transistor. The ohmic contact layer comprises $In_xGa_{1-x}As$ or Ge. The ohmic contact layer has a function of considerably reducing a specific contact resistance of a barrier formed at an interface between the ohmic contact layer and the source and drain electrodes. Thereby, a nonalloyed ohmic contact is formed between the source and drain electrodes and source and drain regions formed in the undoped GaAs layer.

18 Claims, 13 Drawing Sheets

COMPOUND SEMICONDUCTOR DEVICE HAVING NONALLOYED OHMIC CONTACTS

This is a continuation of co-pending application Ser. No. 07/169,890 filed on 3/18/88, now abandoned.

BACKGROUND OF THE INVENTION

The present invention generally relates to compound semiconductor devices, and in particular to compound semiconductor devices such as a high electron mobility transistor and a metal semiconductor field effect transistor. More particularly, the present invention relates to compound semiconductor devices having nonalloyed ohmic contacts.

At present, the practical use of integrated circuit devices utilizing compound semiconductor devices is advanced. Such integrated circuit devices have a good potential for use in future because of their excellent physical properties. Further, improvements of integration level, speeding-up and lower consumed power are desired.

Currently, electronic circuits fabricated as a compound semiconductor integrated circuit device are logic circuits. In general, a unit cell or circuit of a logic circuit is an inverter which consists of a driving-side-transistor and a load-side-transistor. In many cases, each transistor employed in the compound semiconductor integrated circuit device is a high electron mobility transistor (hereafter simply referred to as HEMT) or a metal semiconductor field effect transistor (hereafter simply referred to as MESFET).

As is well known, both alloyed ohmic contacts and Schottky contacts are widely employed for aluminum gallium arsenide/gallium arsenide (AlGaAs/GaAs) HEMTs, GaAs MESFETs and the like. Ohmic contacts are used for source and drain electrodes, and Schottky contacts are used for gate electrodes. The source and drain electrodes are generally made of AuGe, which is subjected to an alloying process to make ohmic contacts with source and drain regions. Schottky gate electrodes are generally made of Al or other metals having high melting points, and makes the Schottky contact with channels. It is noted that the alloyed source and drain electrodes differ from the Schottky gate electrodes in used material. An example of a conventional HEMT having the above configuration is disclosed in U.S. Pat. No. 4,424,525, for example.

The above fact that the alloyed source and drain electrodes and Schottky gate electrodes are made of mutually different materials is disadvantages for realizing compound semiconductor integrated circuits of a higher integration level. This is because contact regions are necessary to connect the source or drain electrode to the Schottky gate electrodes to configure a desired logic circuit. The presence of the contact regions prevents improvements in the integration level. That is, an increased area of the contact regions on a semiconductor chip is needed as the integration level increases. Hence, the possible integration level of the compound semiconductor integrated circuit is unsatisfactory at present.

Further, it is noted that an alloying process for forming ohmic contacts is complex and cumbersome.

SUMMARY OF THE INVENTION

Therefore, a general object of the present invention is to provide a novel and useful compound semiconductor device having nonalloyed ohmic contacts in which the above disadvantages have been eliminated.

A more specific object of the present invention is to provide a compound semiconductor device having nonalloyed ohmic contacts in which source and drain electrodes are coupled with source and drain regions by nonalloyed ohmic contacts.

Another object of the present invention is to provide a compound semiconductor device having nonalloyed ohmic contacts in which source, drain and gate electrodes can be formed by the same metallic material.

Still another object of the present invention is to provide a compound semiconductor device having nonalloyed ohmic contacts in which a source or drain electrode can be integrally formed with a gate electrode.

A further object of the present invention is to provide a compound semiconductor device having nonalloyed ohmic contacts which can provide an integrated circuit of a higher integration level.

A still further object of the present invention is to provide a compound semiconductor device having nonalloyed ohmic contacts which can be manufactured at a higher yield rate and with a higher reliability.

The above objects of the present invention are achieved by a compound semiconductor device having nonalloyed ohmic contacts comprising the following. An active layer made of a first semiconductor is formed on a compound semiconductor substrate. The active layer has a channel region and source and drain regions. An electron supply layer made of a second semiconductor is formed on the active layer. An electron affinity of the second semiconductor is smaller than that of the first semiconductor. An intermediate layer made of a third semiconductor is formed on the electron supply layer and over the source and drain regions. An ohmic contact layer made of a fourth semiconductor is formed on the intermediate layer and forms a nonalloyed ohmic contact with metal. Source and drain electrodes are formed on the ohmic contact layer and over the source and drain regions. A Schottky gate electrode is formed on the electron supply layer.

According to another aspect of the present invention, a connecting layer for connecting the gate electrode to at least one of the source and drain electrodes to form a logic circuit is provided in addition to the above structure. The connecting layer is integrally formed with the gate, source and drain electrodes by use of a same metallic material.

The above objects of the present invention are also achieved by a compound semiconductor device having nonalloyed ohmic contacts comprising the following. An active layer made of a first semiconductor is formed on a compound semiconductor substrate. The active layer has a channel region and source and drain regions. An ohmic contact layer made of a second semiconductor is formed on portions of the active layer over the source and drain regions. Source and drain electrodes are formed on the ohmic contact layer and over the source and drain regions, and form nonalloyed ohmic contact with metal. A Schottky gate electrode is formed on the active layer and over the channel region formed therein. A connecting layer is provided for connecting at least one of the source and drain electrodes and the gate electrode to form a logic circuit. The electrodes and the connecting layer are integrally formed with a same metal.

DETAILED DESCRIPTION

A description will be given of a preferred embodiment of a compound semiconductor device according to the present invention, by referring to FIGS. 1 through 7.

The embodiment depicted in these figures is an improvement of the HEMT which is a typical example of compound semiconductor devices produced by use of selective doping.

Figure 1:
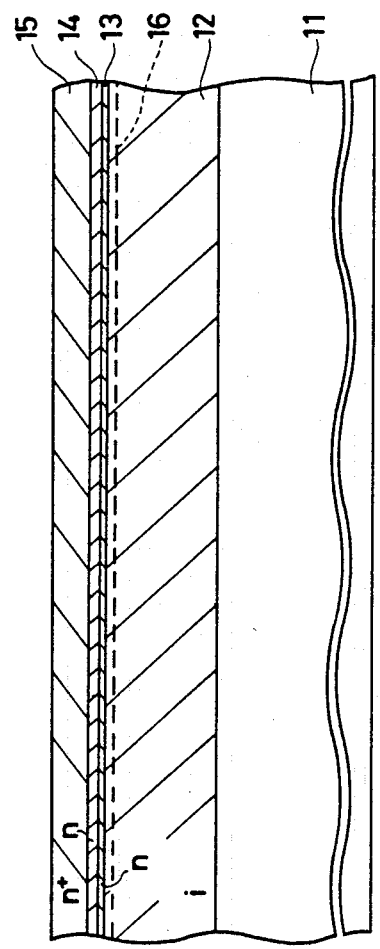
FIG. 1 is an elevational cross sectional view for explaining a first step out of successive steps for producing a preferred embodiment of a HEMT which is an example of a compound semiconductor device according to the present invention.

Referring to FIG. 1, an undoped gallium arsenide (i-GaAs) active layer 12 is grown on a semi-insulating GaAs substrate 11. In the undoped GaAs active layer 12, there are formed two-dimensional electron gas channels (hereafter simply referred to as 2DEG) 16 and source and drain regions. A pair of source and drain regions are located on both sides of one 2DEG channel. An n-type aluminum gallium arsenide (AlGaAs) electron supply layer 13 is grown on the undoped GaAs active layer 12. A GaAs intermediate layer 14 is grown on the n-AlGaAs electron supply layer 13. An $n^+$-type indium gallium arsenide ($In_xGa_{1-x}As: 0 \leq x \leq 1$) ohmic contact layer 15 is grown on the n-GaAs intermediate layer 14. The above layer structure may be grown by any one of molecular beam epitaxy (hereafter simply referred to as MBE), metalorganic chemical vapor deposition (hereafter simply referred to as MOCVD), and vapor phase epitaxy (hereafter simply referred to as VPE). An electron affinity of the n-AlGaAs electron supply layer 13 is smaller than that of the i-GaAs active layer 12. The 2DEG channels 16 are formed in the vicinity of an hetero-interface. The $n^+$-$In_xGa_{1-x}As$ ohmic contact layer 15 is formed by firstly forming a graded layer portion in a range of x=0 to x=0.5 and secondly forming a layer portion with the constant mole fraction x of 0.5 on the graded layer part.

The following parameters may apply for the layers of the HEMT shown in FIG. 1, where d represents an impurity or doping concentration and t is a layer thickness:

A. undoped GaAs active layer 12
  t: 600 (nm)
B. n-AlGaAs electron supply layer 13
  t: 40 (nm)
  d: $1.4 \times 10^{18}$ (cm$^{-3}$)
C. n-GaAs intermediate layer 14
  t: 70 (nm)
  d: $2 \times 10^{18}$ (cm$^{-3}$)
D. graded portion of $n^+$-$In_xGa_{1-x}As$ ohmic contact layer 15
  x value: 0.0→0.5
  t: 150 (nm)
  d: $1 \times 10^{19}$ (cm$^{-3}$)
E. the other portion of $n^+$-$In_xGa_{1-x}As$ ohmic contact layer 15
  x value: 0.5
  t: 50 (nm)
  d: $1 \times 10^{19}$ (cm$^{-3}$)

Figure 2:
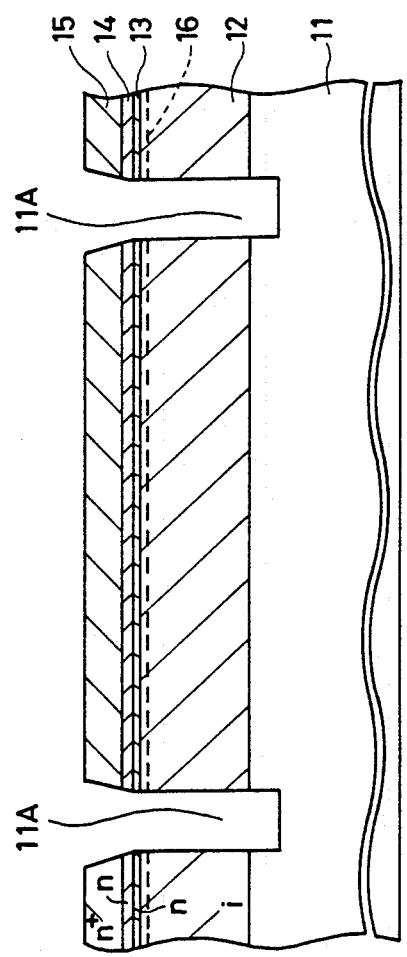
FIG. 2 is an elevational cross sectional view for explaining a step following the step shown in FIG. 1.

By a next step shown in FIG. 2, grooves 11A for separating elements are formed by using a resist process, wet etching, dry etching and so on which are carried out in the conventional photolithography technology. Instead of an etching process, Ion Implantation (for example, $H^+$, $O^+$) can be used to form isolation areas.

Figure 3:
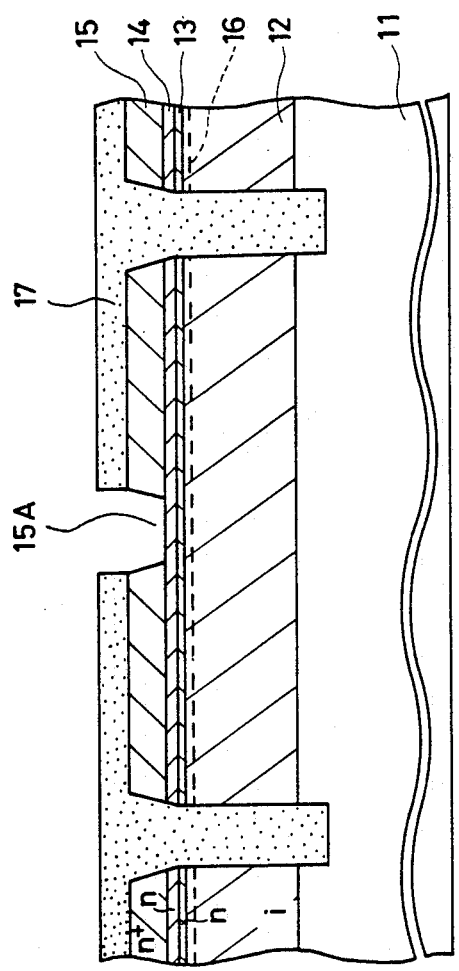
FIG. 3 is an elevational cross sectional view for explaining a step following the step shown in FIG. 2.

Subsequently, as shown in FIG. 3, a photoresist film 17 is formed by using the resist process in the conventional photolithography technology. The photoresist film 17 has openings at its portions at which gate electrodes are to be formed. In FIG. 3, only one of openings formed in the photoresist film 17 is shown. Then, the $n^+$-$In_xGa_{1-x}As$ ohmic contact layer 15 is selectively etched in which etchant containing HF or $H_3PO_4$ as its main component is used. This etching process forms openings 15A in the $n^+$-$In_xGa_{1-x}As$ ohmic contact layer 15. The etching process can be certainly stopped at the surface of the GaAs intermediate layer 14.

Figure 4:
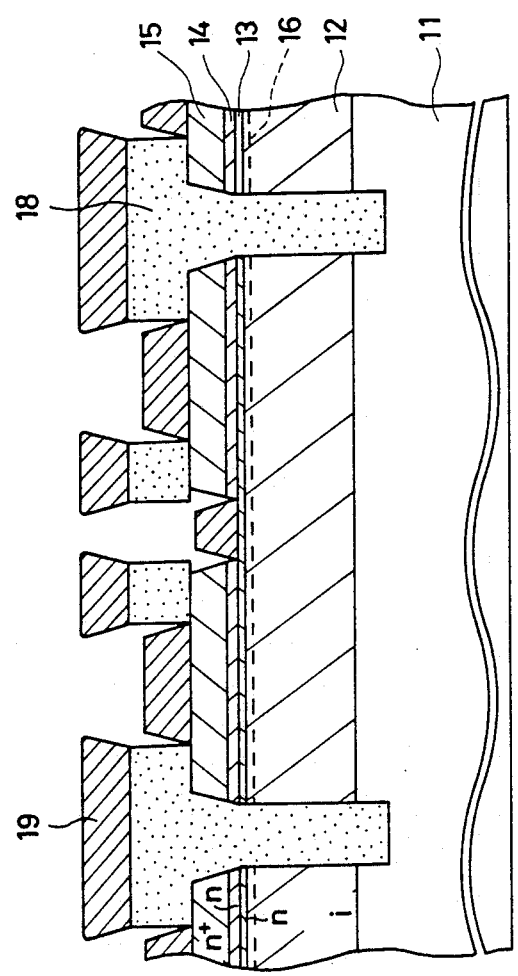
FIG. 4 is an elevational cross sectional view for explaining a step following the step shown in FIG. 3.
Figure 5:
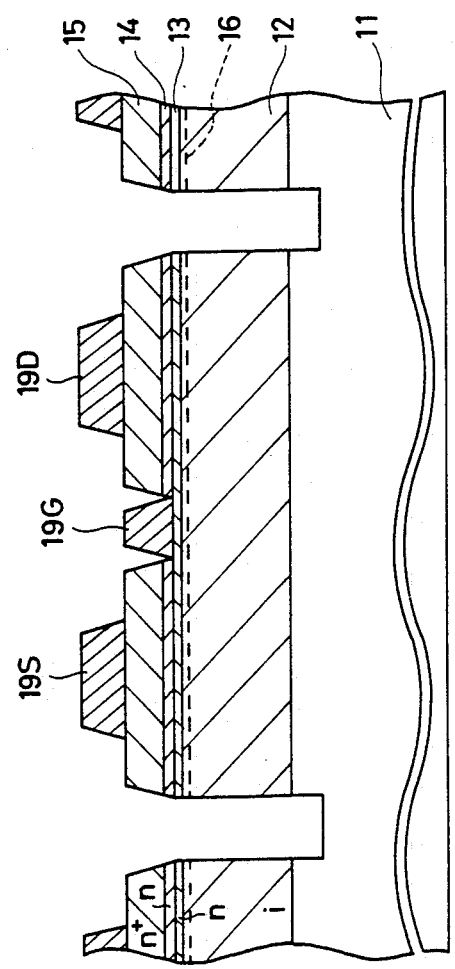
FIG. 5 is an elevational cross sectional view of the embodiment of the HEMT produced by the above successive steps.

Then, as shown in FIG. 4, a photoresist film 18 is deposited by the resist process in the conventional photolithography technology. The photoresist film 18 includes openings at its portions at which gate, source and drain electrodes are desired to be formed. Subsequently, the n-GaAs intermediate layer 14 is subjected to selective etching in which etching gas of $CCl_2F_2+He$ is used. According to this etching process, a selective ratio of GaAs/AlGaAs of approximately 250 can be obtained. In addition, smooth and uniform Schottky interface can be obtained. The selective etching using $CCl_2F_2+He$ gas is effective not only for GaAs/AlGaAs but also for GaAs/InGaAs which is employed in another embodiment described later. That is, an etching rate for InGaAs is approximately 2 (nm/min). This rate is nearly equal to that for AlGaAs. For this reason, the openings formed in the photoresist film 18 at which the source and drain electrodes are to be formed may remain open during the selective etching for the exposed part of the GaAs intermediate layer 14 at which the gate electrode is to be formed. After that, an aluminum (Al) film 19 of a thickness of approximately 400 (nm) is formed in accordance with the conventional vapor evaporation process. A titanium (Ti) film, a platinum (Pt) film, a tungsten silicide (WSi) film and the like may be used instead of the Al film 19.

Thereafter, the configuration thus formed is placed into acetone so as to dissolve and remove the photoresist film 18. Thereby, the Al film 19 is patterned by so-called lift-off, and gate electrode 19G, source electrode 19S and drain electrode 19D are formed. The source and drain electrodes 19S and 19D thus formed are coupled with the n+-InGaAs ohmic contact layer 15 by nonalloyed ohmic contacts, and the gate electrode 19G is coupled with the n-AlGaAs electron supply layer 13 by the Schottky contact.

A description will be given of the effects such that the source and drain electrodes can be coupled with the source and drain electrodes can be coupled layer by the ohmic contacts of low resistance, by referring to FIGS. 6A, 6B and 7.

Figure 6A:
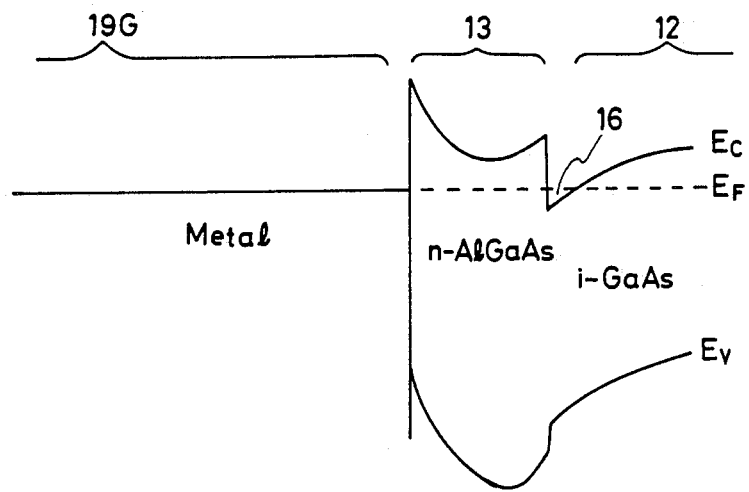
FIGS. 6A and 6B are energy band diagrams of the HEMT shown in FIG. 5.
Figure 6B:
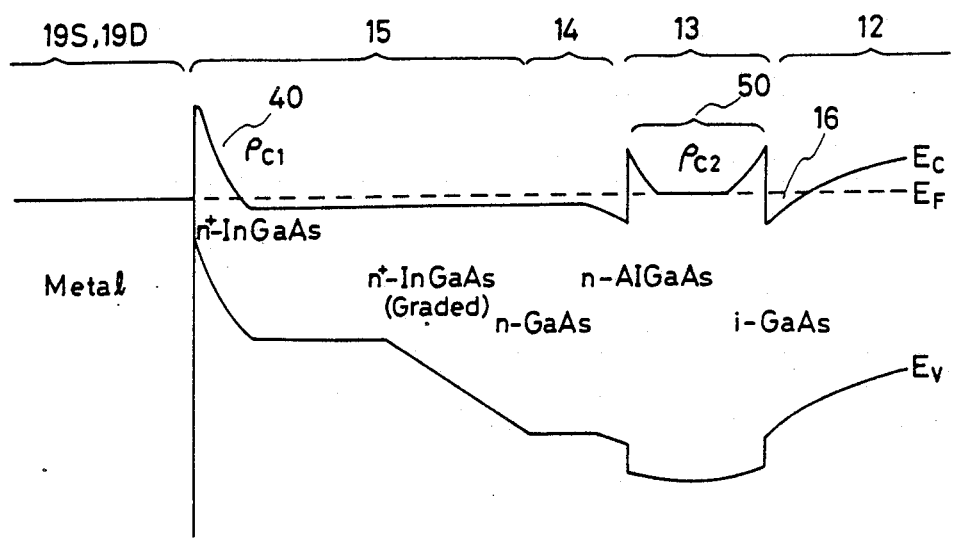

FIGS. 6A and 6B are energy band diagrams of the HEMT produced in accordance with the above successive steps. A horizontal axis of FIG. 6A denotes a depth from the Schottky gate electrode 19G, and a vertical axis thereof denotes energy. A horizontal axis of FIG. 6B denotes a depth from the source electrode 19S or the drain electrode 19D, and a vertical axis thereof denotes energy. In FIGS. 6A and 6B, a symbol $E_V$ denotes a top energy level of a valence band, a symbol $E_F$ denotes a Fermi level, and a symbol $E_C$ denotes a bottom energy level of a conduction band.

As well known, the n-GaAs/n-AlGaAs/undoped GaAs double-heterojunction forms a barrier against electrons which run from the source or drain electrode to the 2DEG channel or vice versa. In addition, a metal-semiconductor barrier against electrons is formed at an interface between the source and drain electrodes made of metallic substance and the semiconductor layer on which these electrodes are provided. The alloying process is aimed at destroying these barriers and thereby making alloyed ohmic contacts with the source and drain regions.

On the other hand, the HEMT provided by the present invention does not employ any alloyed ohmic contacts. From this viewpoint, it would be expected that as shown in FIG. 6B, there exists a metal-semiconductor barrier 40 as well as a n-GaAs/n-AlGaAs/undoped GaAs double-heterojunction barrier 50. In order to achieve the HEMT with nonalloyed ohmic contacts, specific contact resistances $\rho_{c1}$ and $\rho_{c2}$ of the barriers 40 and 50 respectively, must be kept as small as possible. That is, it is essential that a height and width of the barrier 40 and a height of the barrier 50 be small. In this case, it is particularly important that the height and width of the barrier 40 is reduced, i.e. its specific contact resistance $\rho_{c1}$ is made as small as possible. This is because the specific contact resistance $\rho_{c1}$ of the metal-semiconductor barrier 40 is generally greater than the specific contact resistance $\rho_{c2}$ of the double-heterojunction barrier 50. As will be described later, the resistance $\rho_{c2}$ of the barrier 50 can be easily made sufficiently small, in the order of $1 \times 10^{-6}$ ($\Omega \cdot cm^2$) or less by suitably selecting the mole fraction x in the n-$Al_xGa_{1-x}As$ electron supply layer 13.

In order to reduce the contact resistance $\rho_{c1}$ of the barrier 40, the n+-InGaAs ohmic contact layer 15 is employed in the HEMT which is one example of the compound semiconductor devices according to the present invention.

Figure 7:
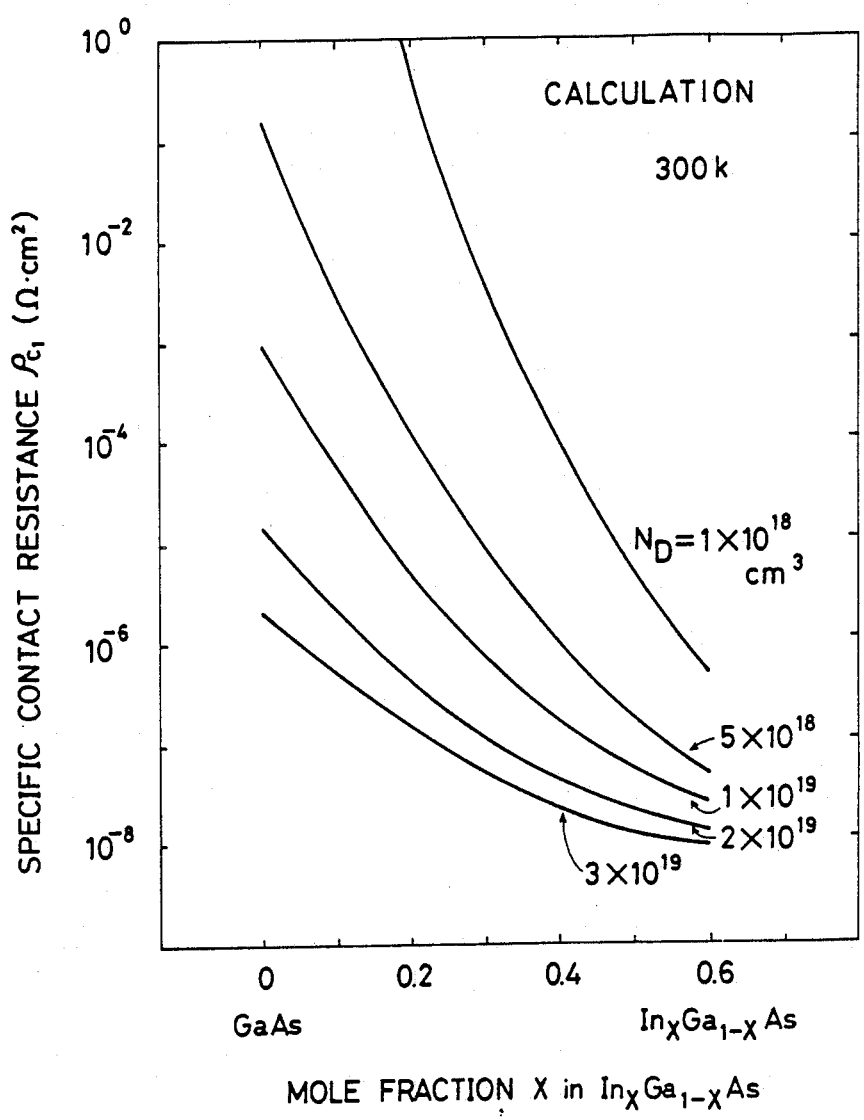
FIG. 7 is a graph showing a specific contact resistance vs. mole fraction x in $In_xGa_{1-x}As$.

FIG. 7 is a graph showing a specific contact resistance as a function of the mole fraction x of $In_xGa_{1-x}As$. A horizontal axis of the graph denotes the mole fraction x of $In_xGa_{1-x}As$, and a vertical axis thereof denotes the specific contact resistance ($\Omega \cdot cm^2$). The illustrated graph reveals that when the x value is equal to 0.5 and the doping concentration $N_D$ is equal to $1 \times 10^{19}$ ($cm^{-3}$) or more, the specific contact resistance $\rho_{c1}$ between the metal and the semiconductor $In_xGa_{1-x}As$ becomes equal to $1 \times 10^{-7}$ ($\Omega \cdot cm^2$) or less at 300K (room temperature). Therefore the height and width of the barrier 40 is sufficiently reduced, and thereby electrons can pass through the barrier 40 by tunneling. It is noted that a specific contact resistance of the alloyed ohmic contacts of the conventional HEMT is approximately $1 \times 10^{-6}$ ($\Omega \cdot cm^2$). Therefore, it can be seen that the nonalloyed ohmic contacts are effective for the HEMT. The specific contact resistance $\rho_{c1}$ is preferably equal to $1 \times 10^{-6}$ ($\Omega \cdot cm^2$) or less, because the nonalloyed ohmic contacts have the barrier 50 of the specific contact resistance $\rho_{c2}$ in addition to the barrier 40. Combinations of the mole fraction x and the doping concentration $N_D$ can be arbitrarily selected so as to satisfy the above condition of the specific contact resistance $\rho_{c1}$. Since InGaAs can be deeply doped up to approximately $5 \times 10^{19}$ ($cm^{-3}$), it is possible to easily obtain the specific contact resistance $\rho_{c1}$ in the order of $1 \times 10^{-6}$ or less ($\Omega \cdot cm^2$). It is seen from the graph that the doping concentration $N_D$ of at least $5 \times 10^{18}$ ($cm^{-3}$) is necessary to obtain the specific contact resistance $\rho_{c1}$ of $1 \times 10^{-6}$ ($\Omega \cdot cm^2$).

In order to investigate the probability of reducing the barrier 50, the specific contact resistance $\rho_{c2}$ of n-$GaAs/n-Al_xGa_{1-x}As$/undoped GaAs double-heterojunction barrier was calculated in which the mole fraction x was used as a parameter for the calculation. This calculation is based on the fact that the height of the above double-heterojunction barrier depends on the value of x in $Al_xGa_{1-x}As$. In this calculation, thermionic emission, thermionic field emission and field emission were considered. Further, the following parameters were used in the calculation: the doping concentration of n-GaAs was $1.8 \times 10^{18}$ ($cm^{-3}$) and that of n-$Al_{0.2}Ga_{0.8}As$ was $1.4 \times 10^{18}$ ($cm^{-3}$); and the conduction-band-edge offset of AlGaAs-GaAs was $\Delta Ec = 0.6 \cdot 0\Delta Eg$. By the calculation of the specific contact resistance $\rho_{c2}$, values of $1.5 \times 10^{-7}$ ($\Omega \cdot cm^2$) at 300K and $3.3 \times 10^{-7}$ ($\Omega \cdot cm^2$) at 77K were obtained where the x value was 0.2. This means that most electrons can pass through the double-heterojunction barrier 50 by tunneling. The above values for the specific contact resistance $\rho_{c2}$ of the barrier 50 are satisfactory, compared with the specific contact resistance of the alloyed ohmic contact of approximately $1 \times 10^{-6}$ ($\Omega \cdot cm^2$). As a result, the specific contact resistance $\rho_{c2}$ of the barrier 50 can be kept at $1 \times 10^{-6}$ ($\Omega \cdot cm^2$) or less by suitably selecting the mole fraction x in the $Al_xGa_{1-x}As$ electron supply layer 13. The total value of the specific contact resistance of the nonalloyed ohmic contact is approximately $1 \times 10^{-6}$ ($\Omega \cdot cm^2$) or less. This value for the specific contact resistance of the nonalloyed ohmic contact is suitable for the ohmic contacts in the HEMT. The value of the specific contact resistance can be further improved to the order of $5 \times 10^{-7}$ ($\Omega \cdot cm^2$) or less by heat treatment at 350° C. for 3 minutes, for example.

On the other hand, as shown in FIG. 6A, the gate electrode 19G forms the Schottky contact with respect to the n-AlGaAs electron supply layer 13. Therefore, the height of the Schottky contact is considerably larger than that of the barrier 50. In other words, the surface Fermi level pinning of the n-AlGaAs electron supply layer 13 beneath the gate electrode 19G contributes to the formation of Schottky contact.

As seen from the above description, the HEMT with the nonalloyed ohmic contacts can be realized. The above explanation can be summarized as follows. Directly under the gate electrode 19G, as shown in FIG. 6A, the electron supply layer 13 exhibits high barrier properties due to the Schottky contact of the gate electrode 19G. On the other hand, directly under the source and drain electrodes 19S and 19D, as shown in FIG. 6B, the low barriers 50 due to the heterojunctions are only formed at both the end surfaces of the electron supply layer 13. Therefore, the nonalloyed ohmic contacts of low resistance can be formed by firstly reducing the contact resistance $\rho_{c1}$ between the contact layer 15 and the source and drain electrodes 19S and 19D and secondly by reducing the contact resistance $\rho_{c2}$ by suitably selecting the mole fraction in the electron supply layer 13. That is, it is considered that the electrons pass, by tunneling, through the junctions between the contact layer 15 and the source and drain electrodes 19S and 19D, and the heterojunctions between both the end surfaces of the electron supply layer 13.

The nonalloyed ohmic contacts of the source and drain electrodes 19S and 19D result in an advantage such that the gate electrode 19G and source and drain electrodes 19S and 19D can be formed of the same material. Therefore, it becomes possible to connect the gate electrode 19G to the source or drain electrode 19S or 19D by a metallic layer used as a connecting line made of material identical to that of the electrodes, without using contact regions. In other words, the connecting line can be integrally formed with the electrodes by using the same material.

In the above embodiment, the n+-InGaAs of the ohmic contact layer 15 includes the graded n+-InGaAs portions. The graded portion is used to avoid the possible discontinuity between n+-InGaAs of the ohmic contact layer 15 and n-GaAs of the intermediate layer 14, because the energy band gap between the energy levels $E_C$ and $E_V$ of n+-InGaAs is smaller than that for n-GaAs. However, the graded n+-InGaAs portion is not necessarily provided in the HEMT with the nonalloyed ohmic contacts according to the present invention. This is because InGaAs can be doped deeply in the order of $1 \times 10^{19}$ (cm$^{-3}$). Hence, even when the n+-InGaAs layer of the constant x value is grown directly on the GaAs intermediate layer 14, a barrier which would be formed at an interface therebetween can be kept small, so that electrons can pass through the barrier by tunneling.

In addition to InGaAs-AlGaAs HEMT described above, the nonalloyed ohmic contacts can be made in an InGaAs-InAlAs HEMT, an InGaAs-InGaP HEMT, a Ge-InAlAs HEMT, a Ge-InGaP HEMT and a Ge-AlGaAs HEMT. And also, it is quite obvious that the nonalloyed ohmic contacts can be made in various pseudomorphic channel HEMTs. A layer structure for each HEMT is listed below:

A. InGaAs-InAlAs HEMT

| | |
|---|---|
| substrate | InP |
| active layer | i-InGaAs |
| electron supply layer | n-InAlAs |
| intermediate layer | n-InGaAs |
| ohmic contact layer | n+-InGaAs |

B. InGaAs-InGaP HEMT

| | |
|---|---|
| substrate | GaAs |
| active layer | i-GaAs |
| electron supply layer | n-InGaP |
| intermediate layer | n-GaAs |
| ohmic contact layer | n+-InGaAs |

C. Ge-InAlAs HEMT

| | |
|---|---|
| substrate | InP |
| active layer | i-InGaAs |
| electron supply layer | n-InAlAs |
| intermediate layer | n-InGaAs |
| ohmic contact layer | n+-Ge |

D. Ge-InGaP HEMT

| | |
|---|---|
| substrate | GaAs |
| active layer | i-GaAs |
| electron supply layer | n-InGaP |
| intermediate layer | n-GaAs |
| ohmic contact layer | n+-Ge |

E. Ge-AlGaAs HEMT

| | |
|---|---|
| substrate | GaAs |
| active layer | i-GaAs |
| electron supply layer | n-AlGaAs |
| intermediate layer | n-GaAs |
| ohmic contact layer | n+-Ge |

A description will be given of a preferred embodiment of a MESFET which is another example of the compound semiconductor device according to the present invention with reference to FIGS. 8 through 11.

Figure 8:
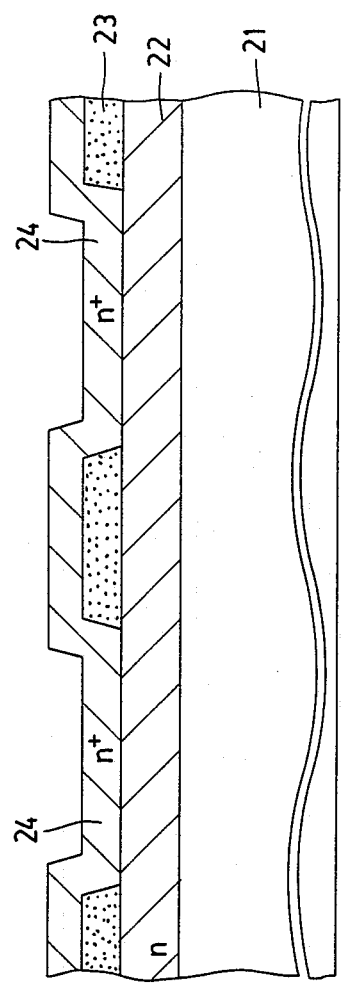
FIG. 8 is an elevational cross sectional view for explaining a first step out of successive steps for producing a preferred embodiment of a MESFET which is another example of the compound semiconductor devices according to the present invention.

Referring to FIG. 8, an n-GaAs active layer 22 is grown on a semi-insulating GaAs substrate 21 by either one of MBE, LPE and VPE. Essential parameters of the n-GaAs active layer 22 are as follows:

t: 1000Å d: $2 \times 10^{17}$ (cm$^{-3}$)

A next step, isolation by using the conventional photolithography technology is carried out, but it is not shown in the following illustrations.

Next, an insulating film 23 made of silicon nitrogen oxide (SiON) or silicon dioxide (SiO$_2$) is deposited and patterned so that portions of the film 23 are formed at which the source and drain are to be formed, as shown in FIG. 8. Deposition of the insulating film 23 may be performed by plasma chemical vapor deposition (called plasma CVD). The insulating film 23 is 300 (nm) in thickness, for example. Patterning can be carried out by the conventional photolithography technology.

Then, an n+-In$_x$Ga$_{1-x}$As ohmic contact layer 24 is grown by MBE or MOCVD, as shown in FIG. 8. As in the case of the n+-In$_x$Ga$_{1-x}$As ohmic contact layer 15 of the InGaAs-AlGaAs HEMT described before, the ohmic contact layer 24 includes a graded portion in which the mole fraction x in n+-In$_x$Ga$_{1-x}$As is gradually changed from 0.0 to 0.5. The other portion of the n+-In$_x$Ga$_{1-x}$As ohmic contact layer 24 which is grown on the graded portion has a constant value x of 0.5. Essential parameters of the ohmic contact layer 24 are as follows:

A. graded portion of the n+-In$_x$Ga$_{1-x}$As ohmic contact layer 24 x value: 0.0→0.5 t: 150 (nm)

d: $1 \times 10^{19}$ (cm$^{-3}$)

B. the other portion of the n+-In$_x$Ga$_{1-x}$As ohmic contact layer 24 x value: 0.5
t: 50 (nm)
d: $1 \times 10^{19}$ (cm$^{-3}$)

In the above structure, portions of the ohmic contact layer 24 on the n-GaAs active layer 22 which is partially exposed through openings formed in the insulating film 23 are single crystal, whereas portions of the ohmic contact layer 24 on the insulating film 23 are polycrystal.

Figure 9:
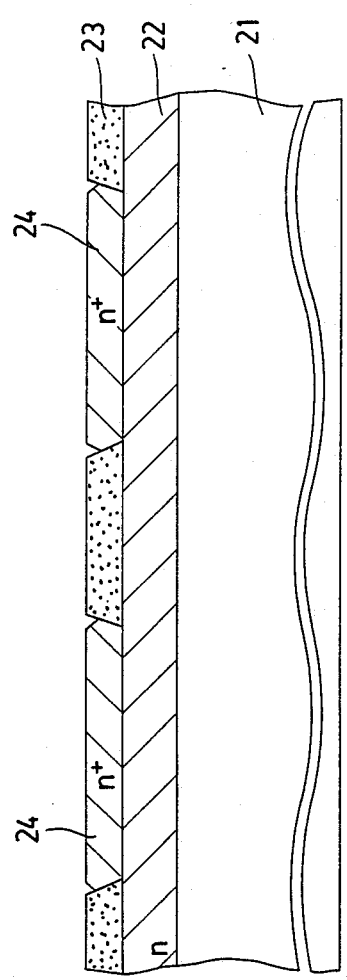
FIG. 9 is an elevational cross sectional view for explaining a step following the step shown in FIG. 8.
Figure 10:
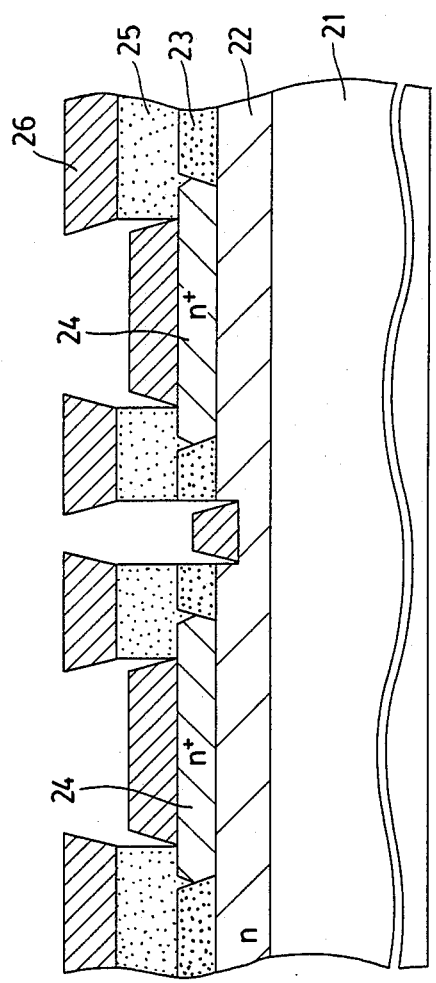
FIG. 10 is an elevational cross sectional view for explaining a step following the step shown in FIG. 9.

A subsequent step is to form a thick photoresist film (not shown) over the entire surface of the structure shown in FIG. 8 and to flaten the surface by use of the spin coat process, for example. Thereafter, as shown in FIG. 9, the entire surface of the photoresist film is uniformly etched by ion milling with argon gas in order to expose the surface of the insulating film 23. Thereby, only the singlecrystal n-In$_x$Ga$_{1-x}$As portions of the layer 24 which are formed into the openings of the insulating film 23 remain.

Thereafter, a photoresist film 25 (FIG. 10) having openings at which the gate, drain and source are to be formed is deposited on the surface of the structure shown in FIG. 9 by the resist process employed in the conventional photolithography technology. Then, the selective etching is performed by HF wet etching, in which the photoresist film 25 is used as a mask in order to form openings at the regions which are to form the respective gate electrodes. Subsequently, the portions of the n-GaAs active layer 22 exposed through the openings are recessed by the HF wet etching process. In this case, the openings formed in the photoresist film 25 may remain open. After that, an Al film 26 of a thickness of 400 (nm), for example, is deposited on the photoresist film 25 by the vapor evaporation process.

Figure 11:
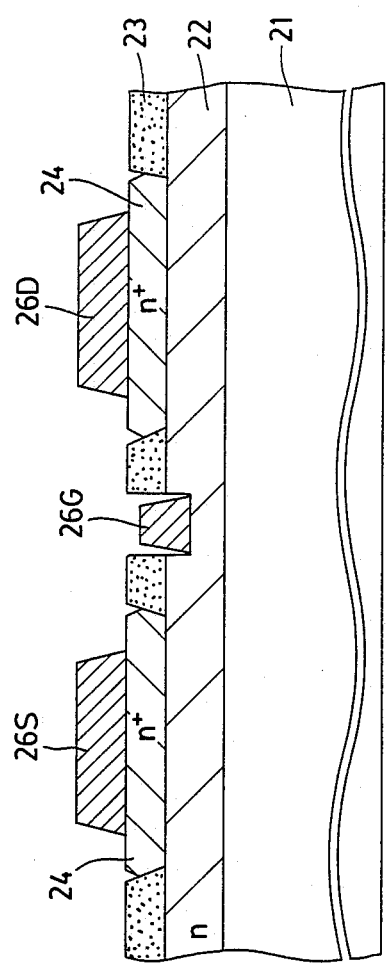
FIG. 11 is an elevational cross sectional view showing the embodiment of the MESFET produced by the above successive steps.

Finally, the structure thus configured is placed into acetone so as to dissolve and remove the photoresist film 25. Thereby, as shown in FIG. 11, the Al film 26 is patterned by lift-off, and gate electrode 26G, source electrode 26S and drain electrode 26D are formed. The source and drain electrodes 26S and 26D thus formed are coupled with the n-InGaAs ohmic contact layer 25 by ohmic contacts, and the gate electrode 26G is coupled with the n-GaAs active layer 22 by a Schottky contact. It is noted that the MESFET thus configured has nonalloyed ohmic contacts. In the embodiment of the MESFET, the graded portion of the ohmic contact layer 24 is not necessarily required.

Figure 12:
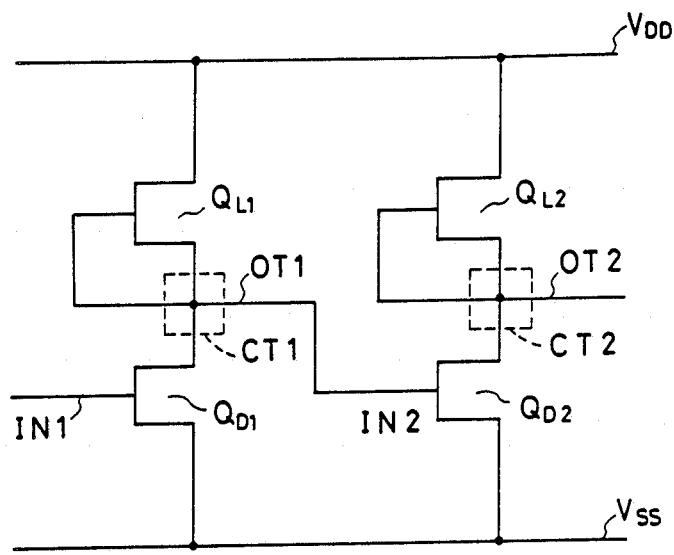
FIG. 12 is a circuit diagram of a logic circuit which is configured by compound semiconductor devices.

FIG. 12 is a circuit diagram of a logic circuit which may be configured using compound semiconductor devices. The illustrated logic circuit consists of two inverters. One of the inverters consists of a driving-side-transistor Q$_{D1}$ and a load-side-transistor Q$_{L1}$, and the other consists of a driving-side-transistor Q$_{D2}$ and a load-side-transistor Q$_{L2}$. An input signal IN1 is applied to a gate terminal of the transistor Q$_{D1}$. A drain terminal of the transistor Q$_{D1}$ and a source terminal of the transistor Q$_{L1}$ are connected to each other. Further, a gate terminal of the transistor Q$_{L1}$ is connected to its source terminal. An output signal OT1 of the inverter at the initial stage is supplied to a gate terminal of the transistor Q$_{D2}$. A drain terminal of the transistor Q$_{D2}$ is connected to source and gate terminals of the transistor Q$_{L2}$. An output signal OT2 of the inverter formed by the transistors Q$_{D2}$ and Q$_{L2}$ is supplied to a next stage (not shown). Symbols V$_{DD}$ and V$_{SS}$ denote a positive power supply potential and a ground power supply potential, respectively.

As described before, contact regions such as CT1 and CT2 are necessary to form the depicted circuit structure by the conventional HEMTs or MESFET with the alloyed ohmic contacts, because the material of the gate electrode is different from that of the source and drain electrodes. The presence of the contact regions prevents improvements in integration level, as mentioned before.

In general, a unit cell in a memory circuit consists of six transistors. In this case, an area of the unit cell of the chip is calculated to be approximately 550 ($\mu$m$^2$) where the integration level is of the order of 16K static random access memory (SRAM). Alternatively, an area of a unit cell composed of four transistors and two resistors (loads) is estimated to be 350 ($\mu$m$^2$). On the other hand, with the compound semiconductor devices according to the present invention, the electrodes of transistors and connection lines between transistors can be integrally formed by the same substance. Hence, the circuit shown in FIG. 12 can be formed without using contact regions such as CT1 and CT2. As a result, an area of the unit cell composed of four transistors and two resistors provided by the present invention is calculated to be approximately 150 to 200 ($\mu$m$^2$). This value is approximately one-third of the area taken by the conventional transistors. In the calculation, the following parameters are used: a region for separating adjacent elements: 3 ($\mu$m); line and space in a connection line: 1.5/2 ($\mu$m); a gate width of a driver: 5 ($\mu$m); a width of a transfer gate: 2 ($\mu$m); and a gate length: 0.5 to 1 ($\mu$m).

Figure 13:
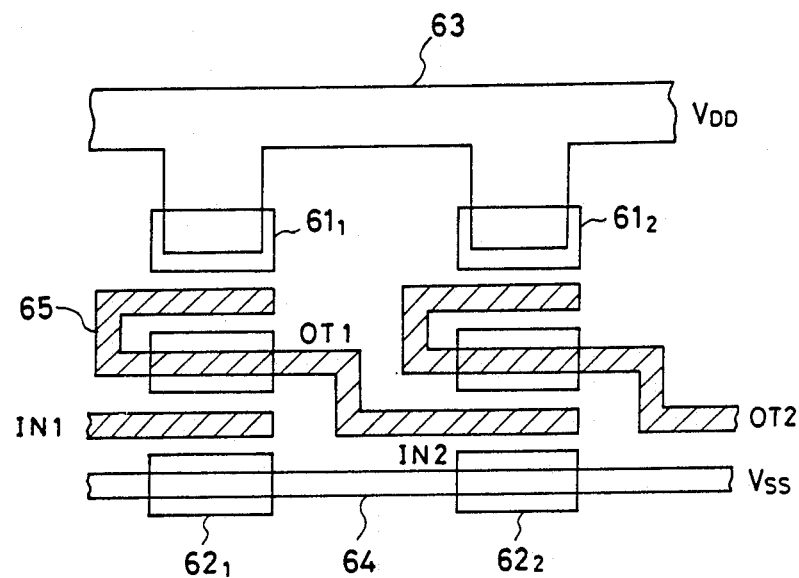
FIG. 13 is a view showing a layout of a part of the logic circuit shown in FIG. 12, in which transistors are employed according to the present invention.

FIG. 13 shows a layout of the circuit shown in FIG. 12, where the transistors according to the present invention are employed. A V$_{DD}$ power supply line 63 is connected to the source terminals of the transistors Q$_{L1}$ and Q$_{L2}$ at contact regions 61$_1$ and 61$_2$, respectively. A V$_{SS}$ power supply line 64 is connected to the source terminals of the transistors Q$_{D1}$ and Q$_{D2}$ at contact regions 62$_1$ and 62$_2$, respectively. The source terminal of the transistor Q$_{L1}$ and the drain terminal of the transistor Q$_{D1}$, the gate terminal of the transistor Q$_{L1}$ and the gate terminal of the transistor Q$_{D2}$ are mutually connected by an integrally formed metallic layer (a connecting line) 65 without using contact regions.

The compound semiconductor device according to the present invention results in an advantage of manufacturing the integrated circuit of a higher speed, a higher productivity and a higher reliability, because it does not use contact regions for connecting the terminals of the transistors made of different materials to each other.

The present invention is not limited to the above embodiments, but various variations and modifications may be made without departing from the scope of the present invention.

What is claimed is:

1. A compound semiconductor device having nonalloyed ohmic contacts comprising:
   a compound semiconductor substrate;
   an active layer comprising a first semiconductor having a first electron affinity and being formed on the compound semiconductor substrate, the active layer having a channel region, a source region and a drain region;
   an electron supply layer comprising a second semiconductor having a second electron affinity and being formed on the active layer, the second electron effinity being smaller than the first electron effinity so that a first heterojunction barrier exists at the junction between said active layer and said electron supply layer;

an intermediate layer comprising a third semiconductor formed on the electron supply layer and over the source and drain regions so that a second heterojunction barrier exists at the junction between said electron supply layer and said intermediate layer;

an ohmic contact layer comprising a fourth semiconductor formed on the intermediate layer;

source and drain electrodes formed on the ohmic contact layer and over the source and drain regions so as to make a nonalloyed ohmic contact with the ohmic contact layer; and a Schottky gate electrode formed on the electron supply layer, wherein said first and second heterojunction barriers enable a substantial number of electrons to tunnel therethrough.

2. A compound semiconductor device having nonalloyed ohmic contacts as claimed in claim 1, wherein the fourth semiconductor is selected from the group consisting of indium gallium arsenide ($In_xGa_{1-x}As$; $0 \leq x \leq 1$) and germanium (Ge).

3. A compound semiconductor device having nonalloyed ohmic contacts as claimed in claim 2, wherein the forth semiconductor has a doping concentration of $5 \times 10^{18}$ (cm$^{-3}$) or over.

4. A compound semiconductor device having nonalloyed ohmic contacts as claimed in claim 2, wherein the ohmic contact layer includes a graded layer portion in which a mole fraction x in $In_xGa_{1-x}As$ increases from an interface with the intermediate layer.

5. A compound semiconductor device having nonalloyed ohmic contacts as claimed in claim 1, wherein the source, drain and gate electrodes comprise a common metallic substance.

6. A compound semiconductor device having nonalloyed ohmic contacts as claimed in claim 1, wherein a resistance of a structure comprising the active layer, the electron supply layer and the intermediate layer below the source and drain electrodes is based on a mole fraction of the second semiconductor and is $1 \times 10^{-6}$ ($\Omega cm^2$) or less.

7. A compound semiconductor device having nonalloyed ohmic contacts as claimed in claim 1, wherein a contact resistance of a barrier formed at an interface between the source or drain electrode and the ohmic contact layer is $1 \times 10^{-6}$ ($\Omega \cdot cm^2$) or less.

8. A compound semiconductor device having nonalloyed ohmic contacts as claimed in claim 1, wherein a resistance of a structure comprising the active layer, the electron supply layer and the intermediate layer below the source and drain electrodes is less than that of a Schottky barrier formed below the gate electrode.

9. A compound semiconductor device having nonalloyed ohmic contacts as claimed in claim 1, wherein the second semiconductor is selected from the group consisting of aluminum gallium arsenide (AlGaAs), indium aluminum arsenide (InAlAs) and indium gallium phosphoride (InGaP).

10. A compound semiconductor device having nonalloyed ohmic contacts comprising:

a compound semiconductor substrate;

an active layer comprising a first semiconductor having a first electron affinity and being formed on the compound semiconductor substrate, the active layer having a channel region, a source region and a drain region;

an electron supply layer comprising a second semiconductor having a second electron affinity and being formed on the active layer, the second electron affinity being smaller than the first electron affinity so that a first heterojunction barrier exists at the junction between said active layer and said electron supply layer;

an intermediate layer comprising a third semiconductor formed on the electron supply layer and over the source and drain regions so that a second heterojunction barrier exists at the junction between said electron supply layer and said intermediate layer;

an ohmic contact layer comprising a fourth semiconductor formed on the intermediate layer;

source and drain electrodes formed on the ohmic contact layer and over the source and drain regions so as to make a nonalloyed ohmic contact with the ohmic contact layer;

a Schottky gate electrode formed on the electron supply layer; and a metallic layer for connecting the gate electrode to at least one of the source and drain electrodes to form a logic circuit, wherein the electrodes and the metallic layer comprise the same layer of the same metallic substance and, wherein said first and second heterojunction barriers enable a substantial number of electrons to tunnel therethrough.

11. A compound semiconductor device having nonalloyed ohmic contacts as claimed in claim 10, wherein the fourth semiconductor is selected from the group consisting of indium gallium arsenide ($In_xGa_{1-x}As$; $0 \leq x \leq 1$) and germanium (Ge).

12. A compound semiconductor device having nonalloyed ohmic contacts as claimed in claim 11, wherein the fourth semiconductor has a doping concentration of $5 \times 10^{18}$(cm$^{-3}$) or over.

13. A compound semiconductor device having nonalloyed ohmic contacts as claimed in claim 11, wherein the ohmic contact layer includes a graded layer portion in which a mole fraction x in $In_xGa_{1-x}As$ increases gradually from an interface with the intermediate layer.

14. A compound semiconductor device having nonalloyed ohmic contacts as claimed in claim 10, wherein a resistance of a structure comprising the active layer, the electron supply layer and the intermediate layer below the source and drain electrodes is based on a mole fraction of the second semiconductor and is $1 \times 10^{-6}$ ($\Omega cm^2$) or less.

15. A compound semiconductor device having nonalloyed ohmic contacts comprising:

a compound semiconductor substrate;

an active layer comprising a first semiconductor formed on the compound semiconductor substrate, the active layer having a channel region, a source and a drain region;

an ohmic contact layer comprising a second semiconductor formed on portions of the active layer over the source and drain regions;

source and drain electrodes formed on the ohmic contact layer and over the source and drain regions so as to make a nonalloyed ohmic contact with the ohmic contact layer;

a Schottky gate electrode formed on the active layer and over the channel region formed therein; and a metallic layer formed to connect at least one of the source and drain electrodes to the gate electrode so that the electrodes and the metallic layer comprise the same layer of the same metallic substance.

16. A compound semiconductor device having nonalloyed ohmic contacts as claimed in claim 15, wherein the second semiconductor is selected from the group consisting of indium gallium arsenide ($In_xGa_{1-x}As$; $0 \leq x \leq 1$) and germanium (Ge).

17. A compound semiconductor device having nonalloyed ohmic contacts as claimed in claim 16, wherein the second semiconductor has a doping concentration of $5 \times 10^{18}$ ($cm^{-3}$) or over.

18. A compound semiconductor device having nonalloyed ohmic contacts as claimed in claim 16, wherein the ohmic contact layer includes a graded layer portion in which a mole fraction x in $In_xGa_{1-x}As$ increases from an interface with the active layer.

* * * * *